United States Patent
Ofner et al.

(10) Patent No.: US 8,357,565 B2
(45) Date of Patent: Jan. 22, 2013

(54) INTEGRATED CIRCUIT PACKAGE AND A METHOD FOR FORMING AN INTEGRATED CIRCUIT PACKAGE

(75) Inventors: Gerald Ofner, Singapore (SG); Swain Hong Yeo, Singapore (SG); Mary Teo, Singapore (SG); Pei Siang Lim, Singapore (SG); Khoon Lam Chua, Singapore (SG)

(73) Assignee: Infinenon Technologies AG, Munich (DE)

( * ) Notice: Subject to any disclaimer, the term of this patent is extended or adjusted under 35 U.S.C. 154(b) by 0 days.

(21) Appl. No.: 12/896,647

(22) Filed: Oct. 1, 2010

(65) Prior Publication Data

US 2011/0020985 A1    Jan. 27, 2011

Related U.S. Application Data

(60) Division of application No. 12/025,556, filed on Feb. 4, 2008, now abandoned, which is a continuation of application No. PCT/SG2005/000270, filed on Aug. 4, 2005.

(51) Int. Cl.
  *H01L 21/44*    (2006.01)
  *H01L 21/48*    (2006.01)
(52) U.S. Cl. .......... 438/108; 438/127; 257/E21.503
(58) Field of Classification Search ......... 438/108, 438/127, E21.503
See application file for complete search history.

(56) References Cited

U.S. PATENT DOCUMENTS

| | | | |
|---|---|---|---|
| 5,612,576 A | 3/1997 | Wilson et al. | |
| 5,864,178 A * | 1/1999 | Yamada et al. | 257/737 |
| 5,895,229 A | 4/1999 | Carney et al. | |
| 6,074,897 A | 6/2000 | Degani et al. | |
| 6,093,972 A * | 7/2000 | Carney et al. | 257/790 |
| 6,194,243 B1 * | 2/2001 | Akram et al. | 438/51 |
| 6,365,441 B1 | 4/2002 | Raiser et al. | |
| 6,519,844 B1 | 2/2003 | Nagarajan et al. | |
| 6,628,679 B1 * | 9/2003 | Talarek | 370/536 |
| 6,632,704 B2 * | 10/2003 | Kumamoto et al. | 438/106 |
| 6,693,239 B2 | 2/2004 | Myers et al. | |
| 6,700,209 B1 * | 3/2004 | Raiser et al. | 257/790 |
| 6,800,946 B2 * | 10/2004 | Chason et al. | 257/778 |
| 7,119,449 B2 | 10/2006 | Workman et al. | |
| 7,141,452 B2 * | 11/2006 | Sambasivam et al. | 438/118 |
| 2002/0043728 A1 | 4/2002 | Harada | |
| 2003/0042035 A1 | 3/2003 | Myers et al. | |

FOREIGN PATENT DOCUMENTS

| | | |
|---|---|---|
| EP | 0 805 486 A1 | 11/1997 |
| EP | 1 184 419 A2 | 3/2002 |
| EP | 1 291 912 A2 | 3/2003 |
| JP | 2000-286276 | 10/2000 |

* cited by examiner

*Primary Examiner* — Nitin Parekh
(74) *Attorney, Agent, or Firm* — Slater & Matsil, L.L.P.

(57) ABSTRACT

A method of forming an integrated circuit package, such as a Flip Chip package, in which a void is provided in the underfill material in the central region of the package between the chip or die and the substrate on which the chip or die is mounted. This reduces delamination of the package as a result of moisture.

21 Claims, 3 Drawing Sheets

*PRIOR ART*

INTEGRATED CIRCUIT PACKAGE AND A METHOD FOR FORMING AN INTEGRATED CIRCUIT PACKAGE This application is a divisional of U.S. application Ser. No. 12/025,556, which was filed on Feb. 4, 2008 now abandoned, which application is a continuation of International Application No. PCT/SG2005/000270, filed Aug. 4, 2005, which designated the United States and was published in English, both applications are incorporated herein by reference.

TECHNICAL FIELD

The present invention relates to a method of manufacturing an integrated circuit package, and to an integrated circuit package manufactured according to the method. In particular, embodiments of the invention relate to a Flip Chip (FC) or Direct Chip Attach (DCA) package in which the chip is attached directly to the substrate, board or carrier by conductive bumps.

BACKGROUND

In integrated circuit packages, the electronic components are mounted on a substrate, circuit board or carrier. The electrical connection between the components and the substrate can be achieved through wire bonds, or through connecting bumps, such as solder bumps. The chip, substrate and interconnection are typically encapsulated to produce the final package.

In Flip Chip packages, also known as Direct Chip Attach packages, the electronic components are directly connected to the substrate, circuit board or carrier by means of conductive bumps on the chip bond pads. To achieve this, the chip is normally turned face down (i.e., flipped) for connection to the substrate.

As well as providing the direct electrical connection between the chip and substrate, the bump provides a thermally conductive path for carrying heat from the chip to the substrate, as well as providing part of the mechanical mounting of the die to the substrate. The bump also acts to space the chip from the substrate, thereby preventing electrical contact between the chip and the substrate.

In Flip Chip assemblies, a non-conductive underfill adhesive is provided under the chip filling the void between the chip and the substrate. This underfill layer acts to protect the bumps from moisture or other environmental hazards, and provides additional mechanical strength to the assembly. Importantly, the underfill mechanically locks together the chip and substrate so that differences in the thermal expansion of the chip and substrate do not break or damage the electrical connection of the bumps. Accordingly, the underfill layer is important in maintaining the integrity of the package, and especially to maintain the integrity of the package despite the ambient conditions.

One problem with known Flip Chip packages is their susceptibility to moisture attack, and in particular "popcorn-delamination" whereby moisture can cause the delamination of the chip, underfill layer and substrate. Such delamination can result in the failure of the electrical connection between the chip and substrate.

It is currently considered that the moisture performance of packages is dependent upon the materials used for the flux, underfill and mold compounds, and to the adhesion between the die and substrate. However, there is a limit in the improvements that can be achieved merely by selection of materials and improvement of the adhesion.

SUMMARY OF THE INVENTION

According to one aspect of the present invention, a method for producing an integrated circuit package is provided in which the underfill material between a chip or die and substrate, circuit board or carrier on which it is mounted includes a void underneath a generally central portion of the chip.

The present inventors have found that popcorn-delamination in Flip Chip packages initiates from the center of the package, and progresses towards the edge of the package. By providing an area around the center of the package in which no underfill material is present, the possibility for delamination between the chip and the underfill layer in this central region can be avoided. By elimination of the initiation site, it is believed that the moisture performance of the package can be improved.

It has been found that the absence of underfill material in the center region of the package does not result in a significant decrease in the performance of the functions of the underfill layer, in particular that this does not significantly decrease the mechanical strength of the assembly, or the ability to compensate for thermal expansion differences between the chip and substrate. Further, since the underfill material can still encapsulate the bumps connecting the chip and substrate, the underfill material is still able to protect the bumps from moisture or other environmental hazards.

The central void can be provided using a seal pass, in which the underfill material is provided along each side of the chip, entrapping the central void. In one example, the seal pass is carried out quickly so that a volume of air or other ambient gas is trapped under the center of the chip preventing the underfill material from flowing into the central void. The fast seal-pass is important when the underfill material has a low viscosity. Alternatively or additionally, the underfill material may have a high viscosity, for example, a viscosity of at least 50 Pa·s. In this case, a seal-pass method is again used to deposit the underfill material along each side of the chip. However, the use of a material of high viscosity minimizes the flow rate of the material, and therefore reduces the need for the seal-pass to be carried out at high speed. By using an underfill material with a high filler loading, for example, with a filler loading of at least 75%, the material will have a sufficiently high viscosity to avoid the need for the seal-pass to be completed quickly. An additional advantage of using a material with a high filler loading is that the material will have improved moisture characteristics.

A suitable underfill material is an epoxy based material. This may be loaded with a filler material such as silica.

By providing a central void in the underfill material, it is possible to reduce the amount of underfill material required, and therefore reduce material costs for production of the integrated circuit package. Further, since less material is required to be provided and cured between the chip and underlying substrate, the time for forming the underfill material layer can be reduced. In particular, this can be achieved as there is no requirement to provide underfill material beneath the entire chip surface, which can reduce the time required to deposit the material, and less curing is required since the amount of underfill material to be cured is reduced. This can also enable the use of a fast-seal pass.

According to a second aspect of the present invention, there is provided an integrated circuit package comprising a chip or die bonded to a substrate, carrier or circuit board, and including an underfill layer between the chip or die and the substrate, carrier or circuit board, in which a void is provided containing no underfill material underneath a generally central part of the chip.

BRIEF DESCRIPTION OF THE DRAWINGS

An embodiment of the present invention will be described, by way of example, with reference to the accompanying drawings, in which.

DETAILED DESCRIPTION OF ILLUSTRATIVE EMBODIMENTS

A conventional Flip Chip package will be described with respect to FIGS. 2 and 3.

Figure 2:
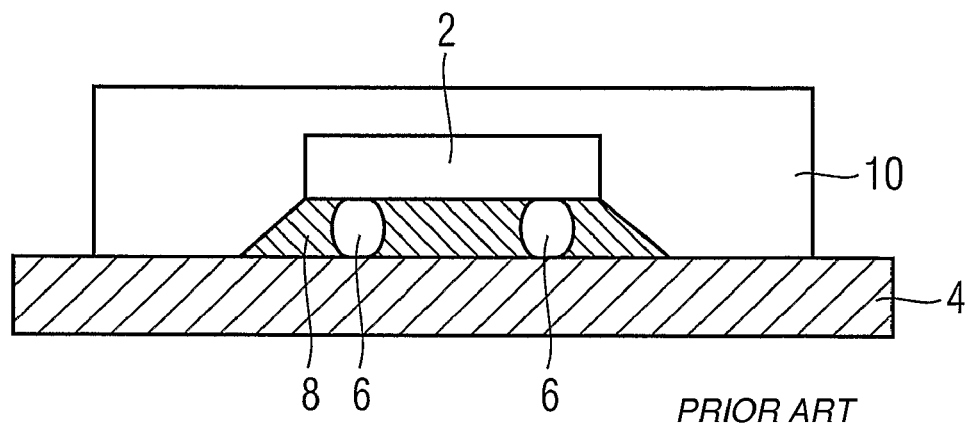
FIG. 2 shows a cross-section of a conventional Flip Chip package.
Figure 3:
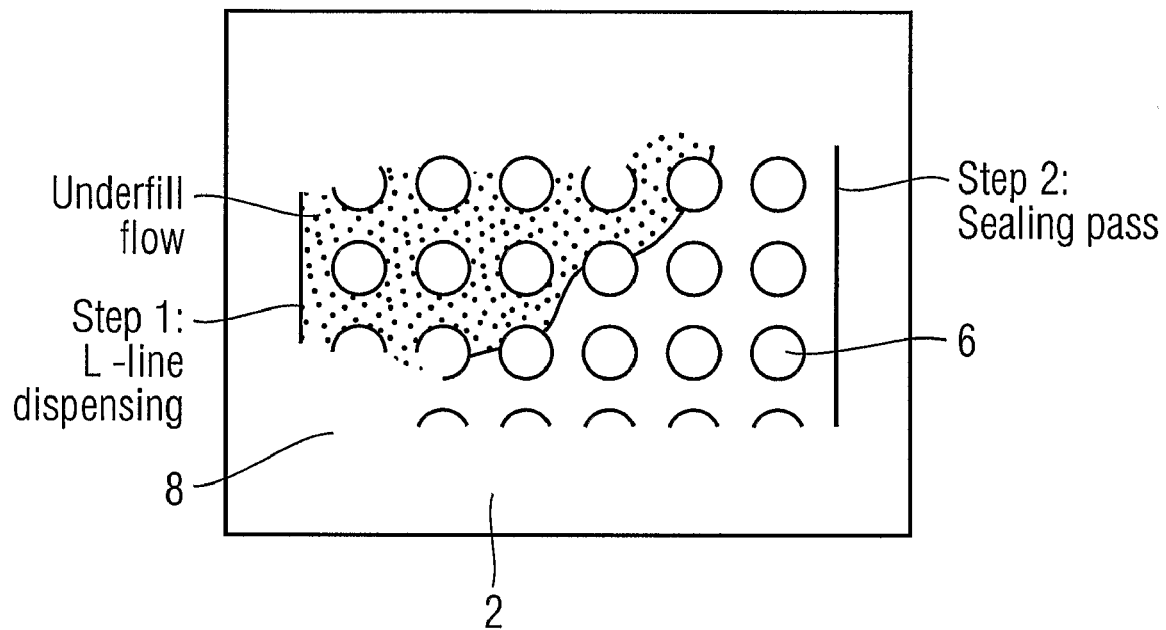
FIG. 3 shows a partially complete view illustrating an underfill process for a known Flip Chip package with L-line dispensing.

As shown in the cross-section of FIG. 2, a chip 2 is mounted on a substrate, carrier, wafer or circuit board 4 by means of conductive bumps 6. In a typical example, the bumps 6 are formed by sputtering, plating or printing a solderable material on the chip 2, and these are connected and soldered to chip bond pads provided on the substrate 4.

A non-conductive underfill layer 8 is provided under the chip 2. As can be seen in FIG. 2, the underfill material surrounds the bumps 6, and fills the entire region underneath the chip between the chip and the substrate. Typically the underfill extends beyond the outer periphery of the chip. It is typical to provide the underfill material by dispensing the material along one or two sides of the periphery of the chip, allowing the material to flow under the chip to fill the area between the chip and substrate. Where material is deposited along one side only, this is known as "single-line" dispensing. Where material is deposited along two adjacent sides, this is known as "L-line dispensing". FIG. 3 shows the situation in which the material is dispensed from the top and left hand sides of the chip, the flow covering the upper left hand corner of the chip as shown in the Figure. When the material has been dispensed underneath the chip, the material is cured.

Figure 1:
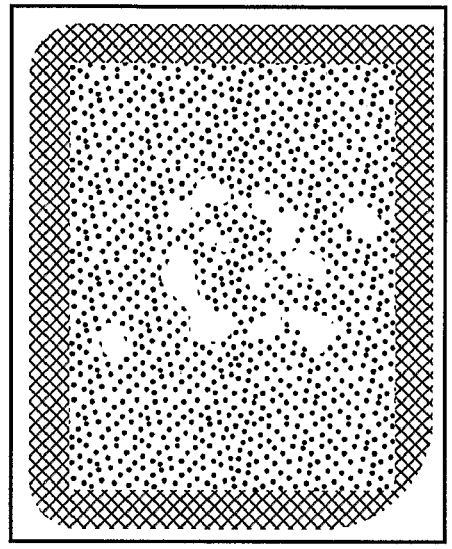
FIG. 1 shows a scanning acoustic microscopy image of a known Flip Chip package after moisture tests, showing popcorn delamination.

A problem with conventional packages formed in this way is the popcorn-delamination that may occur if moisture enters the package. FIG. 1 shows a scanning acoustic microscopy image of a conventional package after moisture tests. The areas of failure can be seen as the light areas around the center of the package. The failure initiates from the center of the package and progresses outwardly towards the edge.

Figure 4:
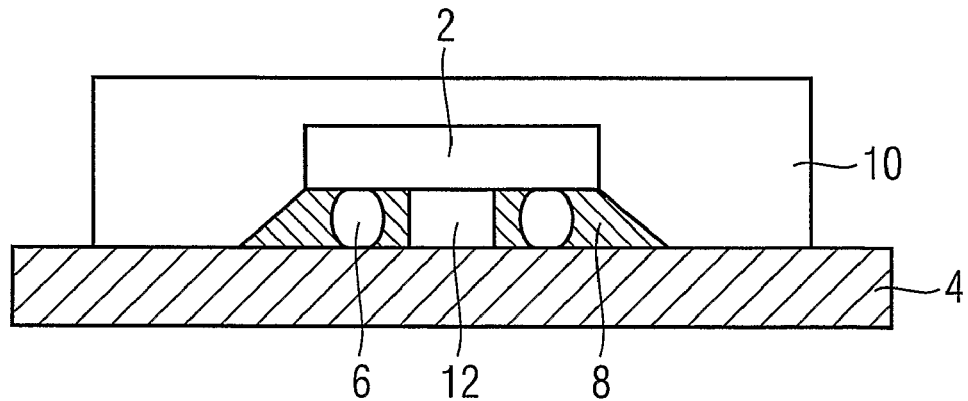
FIG. 4 shows a cross-section of a Flip Chip package made in accordance with the method of an embodiment of the present invention.
Figure 5:
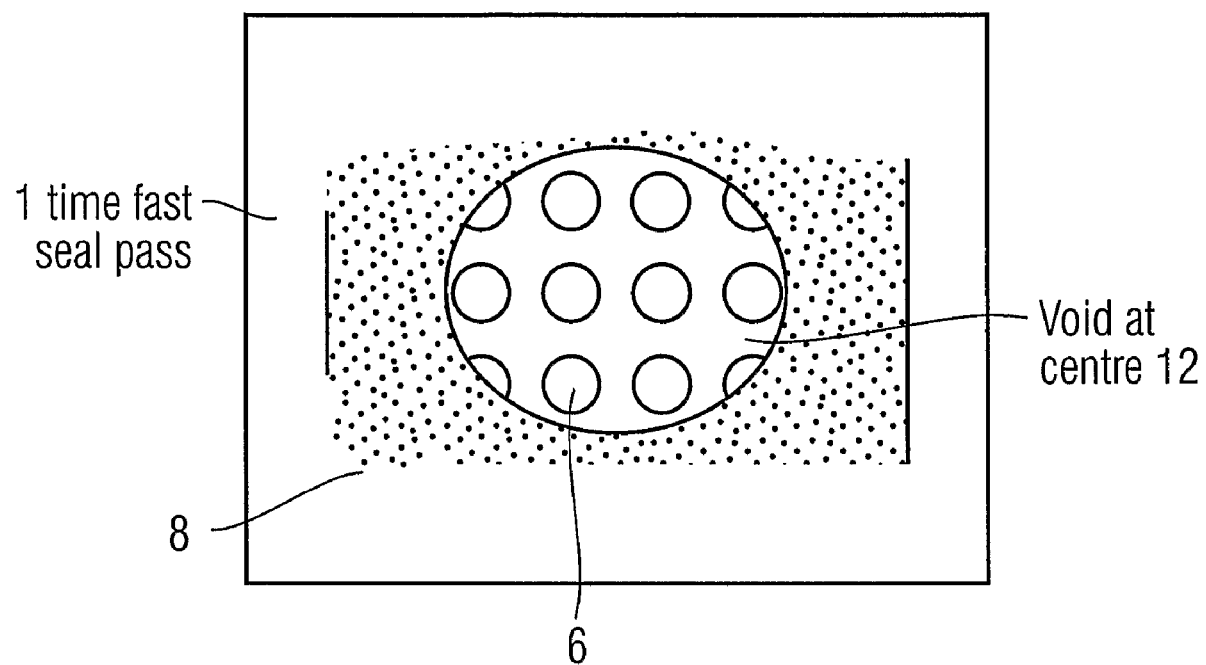
FIG. 5 shows an underfill according to an embodiment of the present invention using scan pass dispensing.

According to the present invention, a void 12 (See FIG. 4) is provided underneath the chip 2 between the chip and the substrate, this void including no underfill material. In FIG. 4, an encapsulation layer 10 encapsulates at least a portion of the die 2, underfill material 8, bumps 6 and substrate 4.

The central void 12 can be achieved by dispensing underfill material around the entire periphery of the chip. By rapidly depositing the material along all sides of the chip, a volume of air or other ambient gas is sealed in the central void defined by the material. This entrapped gas prevents the further inward flow of underfill material and therefore ensures that the central void remains. By using underfill material having a high viscosity, and supplying this around the entire circumference of the chip, the material can be deposited more slowly whilst retaining the central void.

It has been found that this intentional central void removes the interfaces between the substrate 4 and the underfill material 8, and between the underfill material 8 and chip 2 in the central region of the package. By removing the possible interfaces, it is not possible for delamination to occur between the interfaces in this area. As it has been found that the main problem associated with delamination is initiated in this central region, it will be appreciated that removal of the interfaces in this region removes this initiation site.

By introducing the filler material around the entire periphery of the chip and retaining a central void, less underfill material is used compared to prior art packages, and the material can be dispensed and cured more quickly, leading to reduction in manufacturing time and manufacturing materials. This in turn leads to a reduced manufacturing cost.

The inventors have found that retaining underfill material around the central void achieves the advantages of reducing the strain on the bumps to a level consistent with that achieved in existing Flip Chip packages, the strain being much less than associated with packages not having any underfill layer. The results of the strain on the outermost bumps, where the strain is the largest, are given below for an existing chip including underfill, a chip with no underfill layer, and for an embodiment of the present invention.

Although only a single embodiment of the invention has been described in detail, many modifications may be made to it within the scope of the invention as will be clear to the skilled reader.

What is claimed is:

1. A method of forming an integrated circuit package, the method comprising:
   providing a die having a central region and a periphery surrounding the central region;
   providing a substrate to which the die is to be mounted;
   attaching the die to the substrate using a plurality of bumps, the die being spaced from the substrate;
   providing an underfill material in the space between the die and the substrate, leaving a void containing no underfill material between the die and the substrate in the central region of the die, wherein providing the underfill material comprises introducing the underfill material simultaneously from around the entire periphery of the die and trapping a volume of gas such that the trapped gas prevents inward flow of the underfill material under the central region;
   curing the underfill material; and
   encapsulating the die, the substrate and the cured underfill material with an encapsulation material to form an encapsulating layer that is separated from the underfill material by a physical interface.

2. The method according to claim 1, wherein no underfill material is present in the space between the substrate and die below the central region of the die.

3. The method according to claim 2, wherein the underfill material has a viscosity of at least 50 Pa·s.

4. The method according to claim 1, wherein the underfill material has a high filler loading.

5. The method according to claim 4, wherein the filler loading of the underfill material is at least 75%.

6. The method according to claim 1, wherein the underfill material comprises an epoxy based material.

7. The method according to claim 1, wherein the underfill material encapsulates at least one bump of the plurality of bumps.

8. The method of claim 1, wherein providing an underfill material in the space between the die and the substrate comprises:
depositing the underfill material along all sides of the die to seal a volume of gas in the space between the substrate and die below the central region of the die.

9. A method of forming an integrated circuit package, the method comprising:
mounting a die having a central region and a periphery surrounding the central region over a substrate by attaching the die to the substrate using a plurality of bumps, the mounting leaving a gap between the die and the substrate;
forming a void under the central region of the die by
flowing an underfill material simultaneously from all sides of the die into the gap between the die and the substrate,
trapping a volume of gas in the central region, the trapped gas preventing an inward flow of the underfill material under the central region of the die, and
curing the underfill material; and
encapsulating the die, the substrate and the cured underfill material to form an encapsulation layer, wherein a physical interface separates the encapsulation layer from the underfill material.

10. The method according to claim 9, wherein the underfill material has a viscosity of at least 50 Pa·s.

11. The method according to claim 10, wherein a filler loading of the underfill material is at least 75%.

12. The method according to claim 9, wherein the underfill material comprises an epoxy based material.

13. The method according to claim 12, wherein the epoxy based material is loaded with a filler material comprising silica.

14. The method according to claim 9, wherein the underfill material encapsulates at least one bump of the plurality of bumps.

15. The method of claim 9, wherein the flowing and the trapping are performed simultaneously.

16. A method of forming a semiconductor package, the method comprising:
mounting a die having a central region and a periphery surrounding the central region over a substrate by attaching the die to the substrate using a plurality of bumps, the mounting leaving a gap between the die and the substrate;
introducing an underfill material simultaneously from around the entire periphery of the die while trapping a volume of gas under the central region of the die, wherein the trapping prevents a flow of the underfill material into a central portion of the gap under the central region of the die;
solidifying the underfill material to form a void under the central region of the die; and
forming an encapsulation layer covering the die, the substrate and the solidified underfill material, wherein a physical interface separates the encapsulation layer from the underfill material.

17. The method according to claim 16, wherein the underfill material has a viscosity of at least 50 Pa·s.

18. The method according to claim 17, wherein the underfill material comprises an epoxy based material.

19. The method according to claim 18, wherein the epoxy based material is loaded with a filler material comprising silica.

20. The method according to claim 19, wherein a filler loading of the underfill material is at least 75%.

21. The method according to claim 16, wherein the underfill material encapsulates at least some bumps of the plurality of bumps.

* * * * *